(12) United States Patent
Kim

(10) Patent No.: US 7,642,587 B2
(45) Date of Patent: Jan. 5, 2010

(54) FLAT PANEL DISPLAY DEVICE AND METHOD OF FABRICATING THE SAME

(75) Inventor: Jong-Yun Kim, Suwon-si (KR)

(73) Assignee: Samsung Mobile Display Co., Ltd., Yongin, Gyunggi-do (KR)

( * ) Notice: Subject to any disclaimer, the term of this patent is extended or adjusted under 35 U.S.C. 154(b) by 0 days.

(21) Appl. No.: 12/079,720

(22) Filed: Mar. 28, 2008

(65) Prior Publication Data

US 2008/0237585 A1     Oct. 2, 2008

(30) Foreign Application Priority Data

Mar. 28, 2007 (KR) .................. 10-2007-0030478

(51) Int. Cl.
*H01L 27/108* (2006.01)
(52) U.S. Cl. .............. 257/296; 257/300; 257/304; 257/307; 257/E27.016
(58) Field of Classification Search ........... 257/296, 257/300, 304, 307
See application file for complete search history.

(56) References Cited

U.S. PATENT DOCUMENTS

2005/0121677 A1* 6/2005 Kim et al. ............. 257/72
2006/0091399 A1* 5/2006 Lee ....................... 257/72
2007/0159565 A1* 7/2007 Segawa et al. ........ 349/38

FOREIGN PATENT DOCUMENTS

| KR | 10-1996-0029861 | 8/1996 |
| KR | 1020010004560 | 1/2001 |
| KR | 10-2003-0054795 A | 7/2003 |
| KR | 10-2003-0028526 | 8/2003 |
| KR | 10-2006-0000848 A | 1/2006 |
| KR | 1020060021595 | 3/2006 |

OTHER PUBLICATIONS

Notice of Allowability issued on Aug. 16, 2008 from the Korean Intellectual Property Office in the Korean Patent Application No. 10-2007-0030478.

* cited by examiner

*Primary Examiner*—Wai-Sing Louie
(74) *Attorney, Agent, or Firm*—Knobbe Martens Olson & Bear LLP

(57) ABSTRACT

A flat panel display device including a first region having an organic light emitting diode and a thin film transistor and a second region having a capacitor is disclosed. The capacitor comprises first, second, and third electrodes, where the area of a third capacitor electrode is reduced, thereby ensuring a distance between a first power voltage line and the third capacitor electrode. The total area of the capacitor is compensated by increasing the area of the first capacitor electrode. Thus, the area of the third capacitor electrode is reduced while the total capacitance of the capacitor is maintained, thereby preventing a dark spot caused by a short circuit between the first power voltage line and the third capacitor electrode.

10 Claims, 6 Drawing Sheets

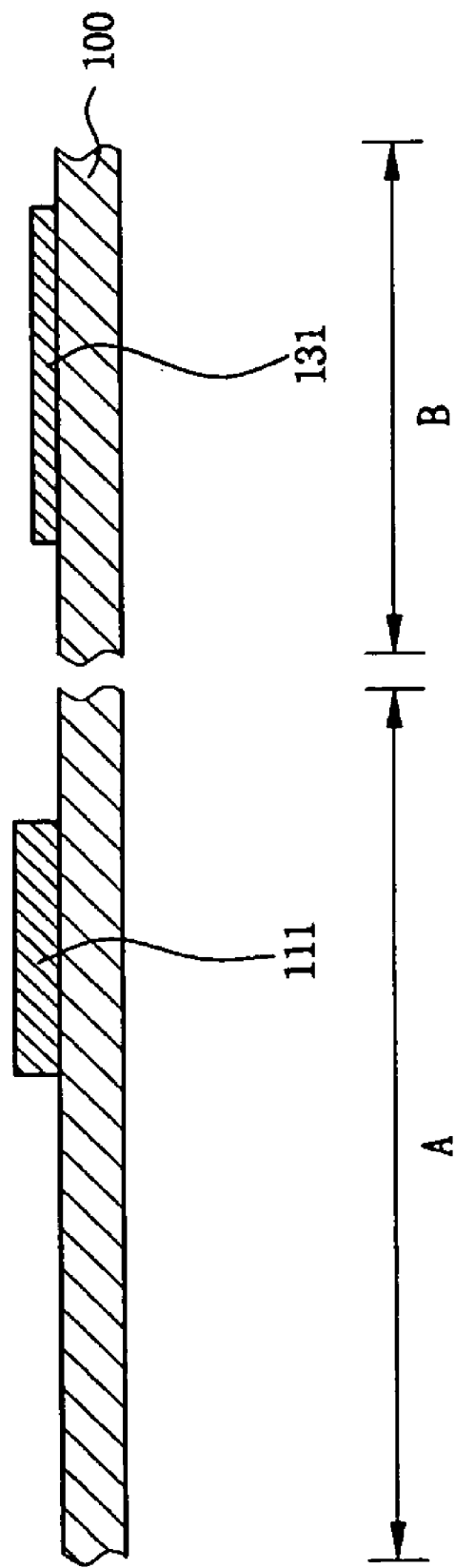

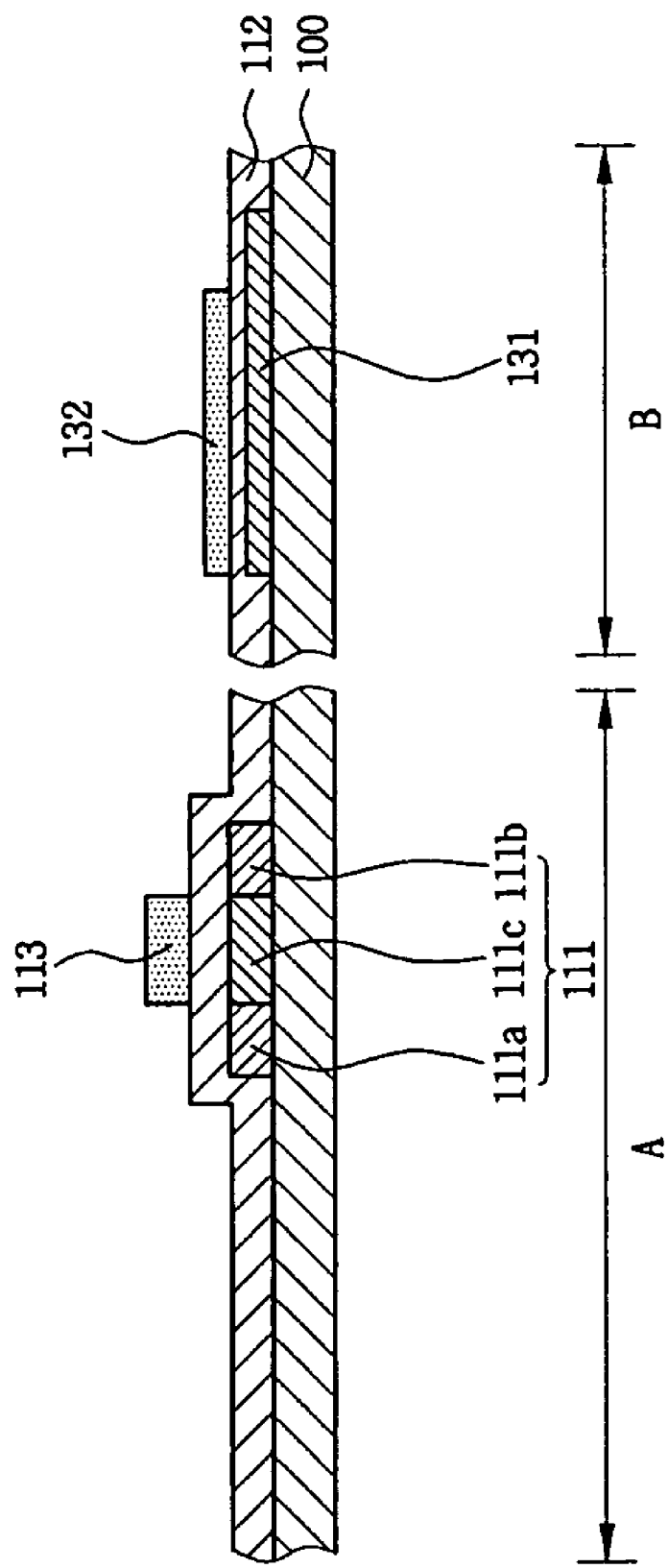

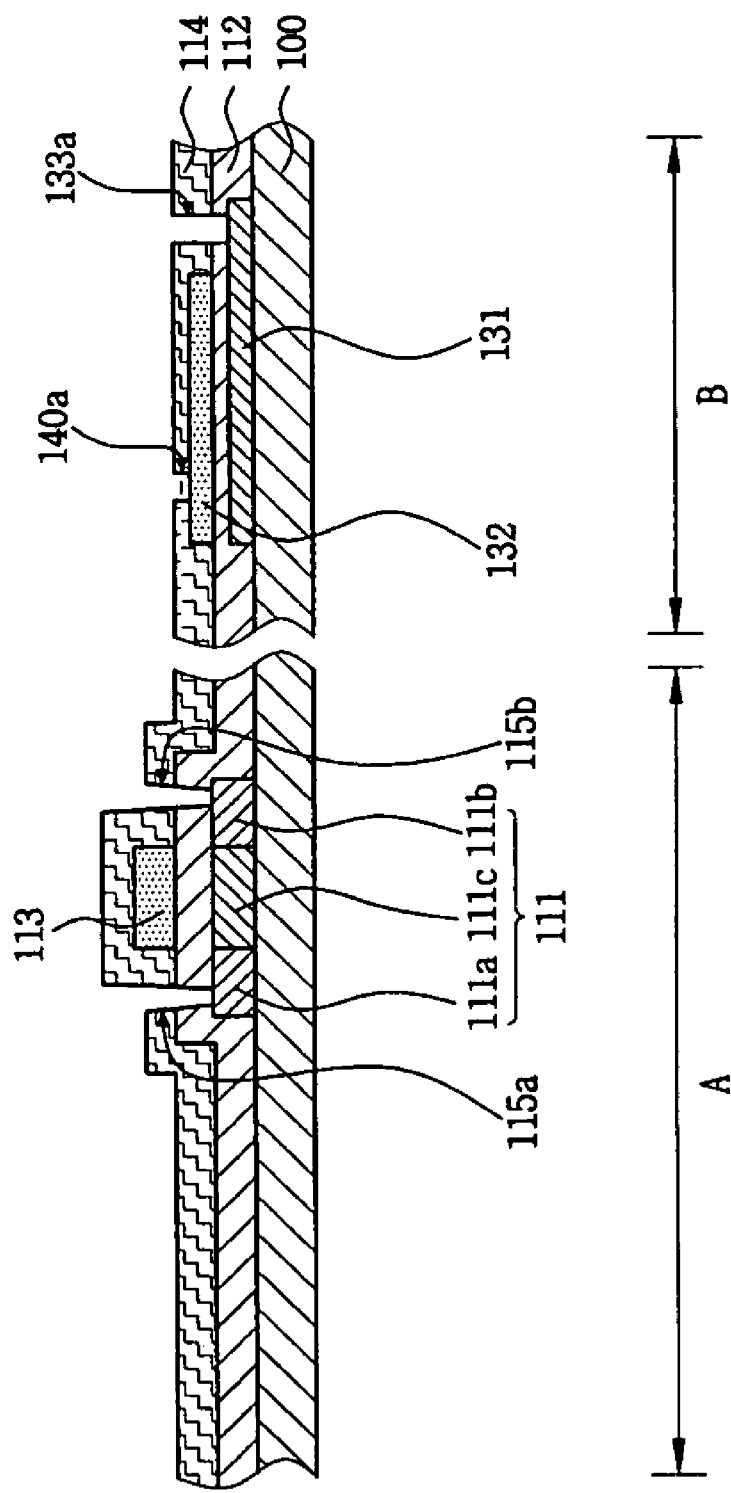

US 7,642,587 B2

FLAT PANEL DISPLAY DEVICE AND METHOD OF FABRICATING THE SAME

CROSS-REFERENCE TO RELATED APPLICATION

This application claims the benefit of Korean Patent Application No. 2007-30478, filed Mar. 28, 2007, the disclosure of which is hereby incorporated herein by reference in its entirety.

BACKGROUND OF THE INVENTION

1. Field

The field relates to a flat panel display device and a method of fabricating the same, and more particularly, to a flat panel display device including a capacitor having first and second capacitors, wherein the capacitor has a first capacitor electrode and a third capacitor electrode which are different in area.

2. Description of Related Technology

Generally, an organic light emitting diode (OLED) display device, one kind of a flat panel display device, is a self-emissive display device which electrically excites an emissive organic compound so as to emit light, and is classified as a passive-matrix device or an active-matrix device based on its driving mechanism.

The active-matrix OLED display device includes a thin film transistor, and is suitable for large-sized display device because of less power consumption than the passive-matrix OLED display device.

This active-matrix OLED display device includes thin film transistors and capacitors in a compensation circuit.

FIG. 1 is a cross-sectional view of a conventional OLED display device.

Referring to FIG. 1, an amorphous silicon layer is formed on a substrate 10 including a first region a in which an organic light emitting diode (OLED) and a thin film transistor are formed and a second region b in which a capacitor is formed, and then crystallized to form a polycrystalline silicon layer.

After crystallization into the polycrystalline silicon layer, the polycrystalline silicon layer is patterned so as to form a semiconductor layer 11 in the first region a, and form a first capacitor electrode 31 in the second region b.

Then, a gate insulating layer 12 is formed on the entire surface of the substrate, and a gate metal layer is deposited on the gate insulating layer 12. The gate metal layer is patterned so as to form a gate electrode 13 corresponding to a certain region of the semiconductor layer 11 in the first region a.

The gate metal layer is patterned so as to form a second capacitor electrode 32 corresponding to a certain region of the first capacitor electrode 31 on the gate insulating layer 12 in the second region b, while forming the gate electrode 13.

Subsequently, n- or p-type impurity ions are injected into the semiconductor layer 11, thereby forming source and drain regions 11a and 11b. Here, a channel region 11c is formed between the source and drain regions 11a and 11b of the semiconductor layer 11.

After forming an interlayer insulating layer 14 on the entire surface of the substrate, the interlayer insulating layer 14 and the gate insulating layer 12 are etched in the first region a, thereby forming first and second contact holes 15a and 15b which partially expose the source and drain regions 11a and 11b of the semiconductor layer 11, respectively.

A third contact hole 40a partially exposing the second capacitor electrode 32 and a fourth contact hole 33a partially exposing the first capacitor electrode 31 are formed in the second regions b.

Then, source and drain metal layers are deposited on the interlayer insulating layer 14 and are then patterned in a certain shape in the first region a so as to form source and drain electrodes 15 which are connected with the source and drain regions 11a and 11b of the semiconductor layer 11 through the first and second contact holes 15a and 15b, respectively.

Also, a first power voltage line 40 connected with the second capacitor electrode 32 through a third contact hole 40a, and a third capacitor electrode 33 connected with the first capacitor electrode 31 through a fourth contact hole 33b are formed in the second region b.

The first capacitor electrode 31 and the second capacitor electrode 32 constitute a first capacitor. Here, the first capacitor electrode 31 is a lower electrode of the first capacitor, and the second capacitor electrode 32 is an upper electrode of the first capacitor. Also, the second capacitor electrode 32 and the third capacitor electrode 33 constitute a second capacitor, wherein the second capacitor electrode 32 is a lower electrode of the second capacitor, and the third capacitor electrode 33 is an upper electrode of the second capacitor.

Here, the first capacitor electrode 31 and the third capacitor electrode 33 have the same area so that an area $S_2$ corresponding to the third capacitor electrode 33 overlap of the second capacitor electrode 32 is equal to an area $S_1$ corresponding to the second capacitor electrode 32 overlap of the first capacitor electrode 31.

Thus, when the permittivity and distance between the first capacitor and the second capacitor are equal, the capacitances of the capacitors are also equal.

A passivation layer 16 is formed on the entire surface of the substrate, and a planarization layer (not illustrated) may be formed of an organic material to reduce a step height on the substrate.

Here, a pixel electrode 17 is formed in the first region a, which is electrically connected with one of the source and drain electrodes 15 through a via hole passing through the passivation layer 16 or the planarization layer.

Subsequently, a pixel defining layer 18 including an opening partially exposing the pixel electrode 17 is formed. An organic layer 19 including an organic emitting layer is formed on the pixel electrode 17 exposed by the opening, and a counter electrode 20 is formed on the entire surface of the substrate, and thus the OLED display device may be completed.

However, the distance between the third capacitor electrode 33 and the first power voltage line 40 is relatively small, which is within 5 μm, because the area of the third capacitor electrode 33 has to be large to increase the capacitance of the capacitor.

The small distance between interconnections may cause a short circuit between the third capacitor electrode 33 and the first power voltage line 40 in the patterning process.

As a result, the capacitor is short-circuited, so that the voltage between the gate and the source electrode of the thin film transistor is 0 and no current flows, and thus a dark spot occurs in the OLED display device.

SUMMARY OF CERTAIN INVENTIVE ASPECTS

One aspect is a flat panel display device, including a substrate with a first region on which an organic light emitting diode and a thin film transistor are formed and a second region on which a capacitor is formed. The device also includes a semiconductor layer with source and drain regions on the first region, a first capacitor electrode formed on the second region, a gate insulating layer formed on the substrate, a gate electrode formed on the first region on the gate insulating layer, a second capacitor electrode formed on the second region, an interlayer insulating layer formed on the substrate, source and drain electrodes formed on the first region on the interlayer insulating layer and connected with the semiconductor layer through first and second contact holes. The device also includes a first power voltage line formed on the second region connected with the second capacitor electrode through a third contact hole, and a third capacitor electrode formed on the second region connected with the first capacitor electrode through a fourth contact hole, and having a different area from the first capacitor electrode.

Another aspect is a method of fabricating a flat panel display device. The method includes providing a substrate including a first region on which an organic light emitting diode and a thin film transistor are formed and a second region on which a capacitor is formed. The method also includes forming a semiconductor layer on the first region, forming a first capacitor electrode on the second region, forming a gate insulating layer on the substrate, forming a gate electrode on the first region on the gate insulating layer, forming a second capacitor electrode on the second region on the gate insulating layer, and injecting a dopant into the semiconductor layer and forming source and drain regions. The method also includes forming an interlayer insulating layer on the substrate, forming first and second contact holes respectively exposing the source and drain regions on the interlayer insulating layer, forming third and fourth contact holes respectively exposing the first capacitor electrode and the second capacitor electrode, forming source and drain electrodes connected with the source and drain regions through the first and second contact holes on the first region on the interlayer insulating layer, forming a first power voltage line connected with the second capacitor electrode through the third contact hole, and forming a third capacitor electrode connected with the first capacitor electrode through the fourth contact hole and having a different area from the first capacitor electrode on the second region on the interlayer insulating layer.

BRIEF DESCRIPTION OF THE DRAWINGS

The above and other features will be described in reference to certain embodiments thereof with reference to the attached drawings in which:

FIGS. 2A to 2E are cross-sectional views illustrating a method of fabricating an OLED display device.

DETAILED DESCRIPTION OF CERTAIN INVENTIVE EMBODIMENTS

Figure 1:
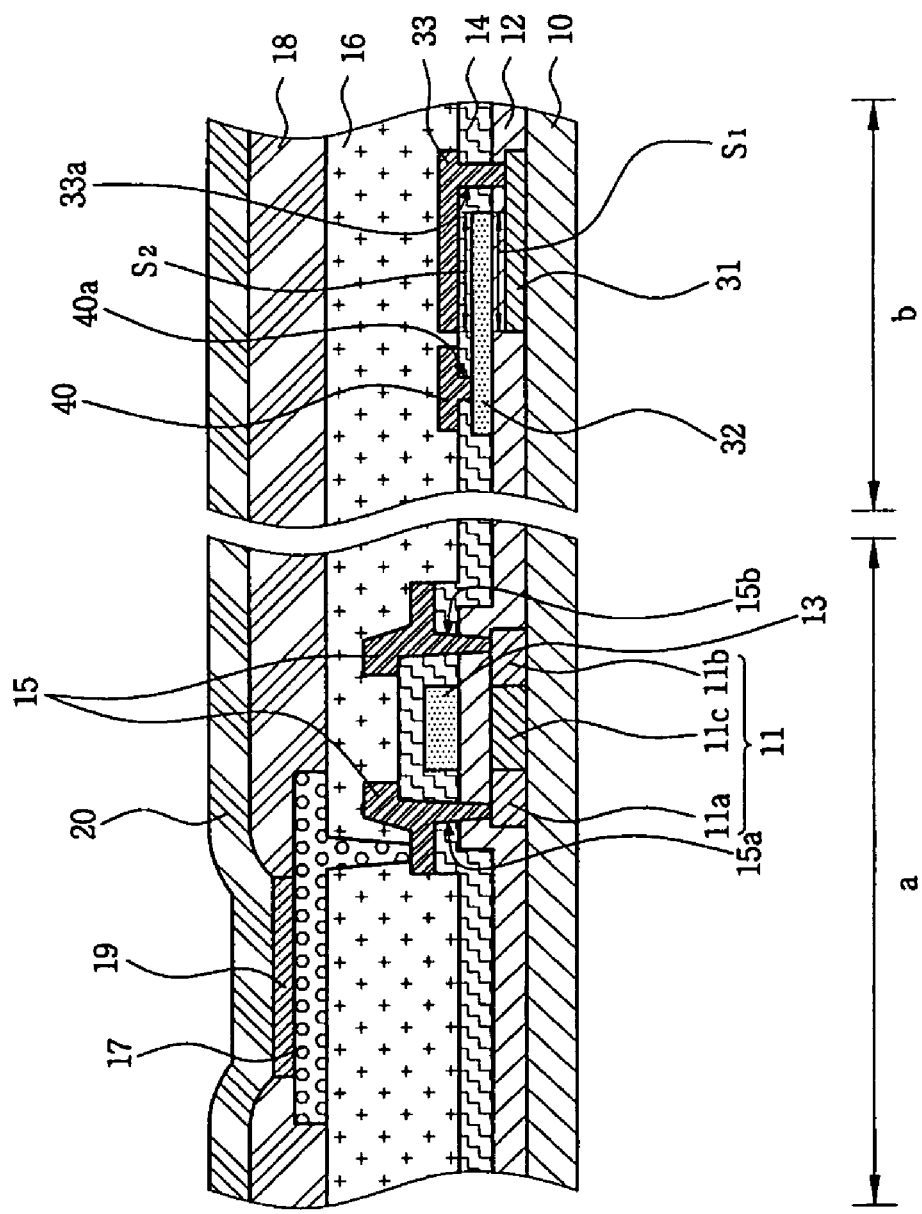
FIG. 1 is a cross-sectional view of a conventional organic light emitting diode (OLED) display device.

Certain embodiments will now be described more fully hereinafter with reference to the accompanying drawings.

FIGS. 2A to 2E are cross-sectional views illustrating an innovative method of fabricating an OLED display device.

First, referring to FIG. 2A, a buffer layer (not illustrated) is formed to prevent the diffusion of moisture or impurities, or to control thermal transmission in the crystallization on a substrate 100.

An amorphous silicon layer is formed on the buffer layer, and then crystallized to form a polycrystalline silicon layer. The crystallization of the amorphous silicon layer may be performed by excimer laser annealing (ELA), sequential lateral solidification (SLS), metal induced crystallization (MIC) or metal induced laser crystallization (MILC). The polycrystalline silicon layer includes a first region A in which an organic light emitting diode (OLED) and a thin film transistor are formed and a second region B in which a capacitor (Cst) is formed.

The polycrystalline silicon layer is patterned in a certain shape, so as to form a first capacitor electrode 131 in the second region B while forming a semiconductor layer 111 in the first region A.

Referring to FIG. 2B, a gate insulating layer 112 is formed on the entire surface of the substrate, and a gate metal layer, which may, for example, be formed of one of aluminum (Al), an Al alloy, molybdenum (Mo) and a Mo alloy, is deposited on the gate insulating layer 112.

Then, the gate metal layer is patterned so as to form a gate electrode 113 corresponding to a certain region of the semiconductor layer 111 in the first region A. While forming the gate electrode 113, a second capacitor electrode 132 corresponding to a certain region of the first capacitor electrode 131 is formed by patterning the gate metal layer on the gate insulating layer 112 in the second region B.

An n- or p-type dopant is injected into the semiconductor layer 111 using the gate electrode 113 as a mask so as to form source and drain regions 111a and 111b.

Beneath the gate electrode 113, a channel region 111c is formed between the source and drain regions 111a and 111b of the semiconductor layer 111.

Referring to FIG. 2C, an interlayer insulating layer 114 is formed on the entire surface of the substrate.

Then, the interlayer insulating layer 114 and the gate insulating layer 112 are etched to respectively form first and second contact holes 115a and 115b at least partially exposing the source and drain regions 111a and 111b of the semiconductor layer 111 in the first region A. A third contact hole 140a partially exposing the second capacitor electrode 132 and a fourth contact hole 133a partially exposing the first capacitor electrode 131 are formed in the second region B.

The buffer layer (not illustrated), the gate insulating layer 112 and the interlayer insulating layer 114 may be formed of $SiO_2$, SiNx, or a multi-layer thereof.

Figure 2D:
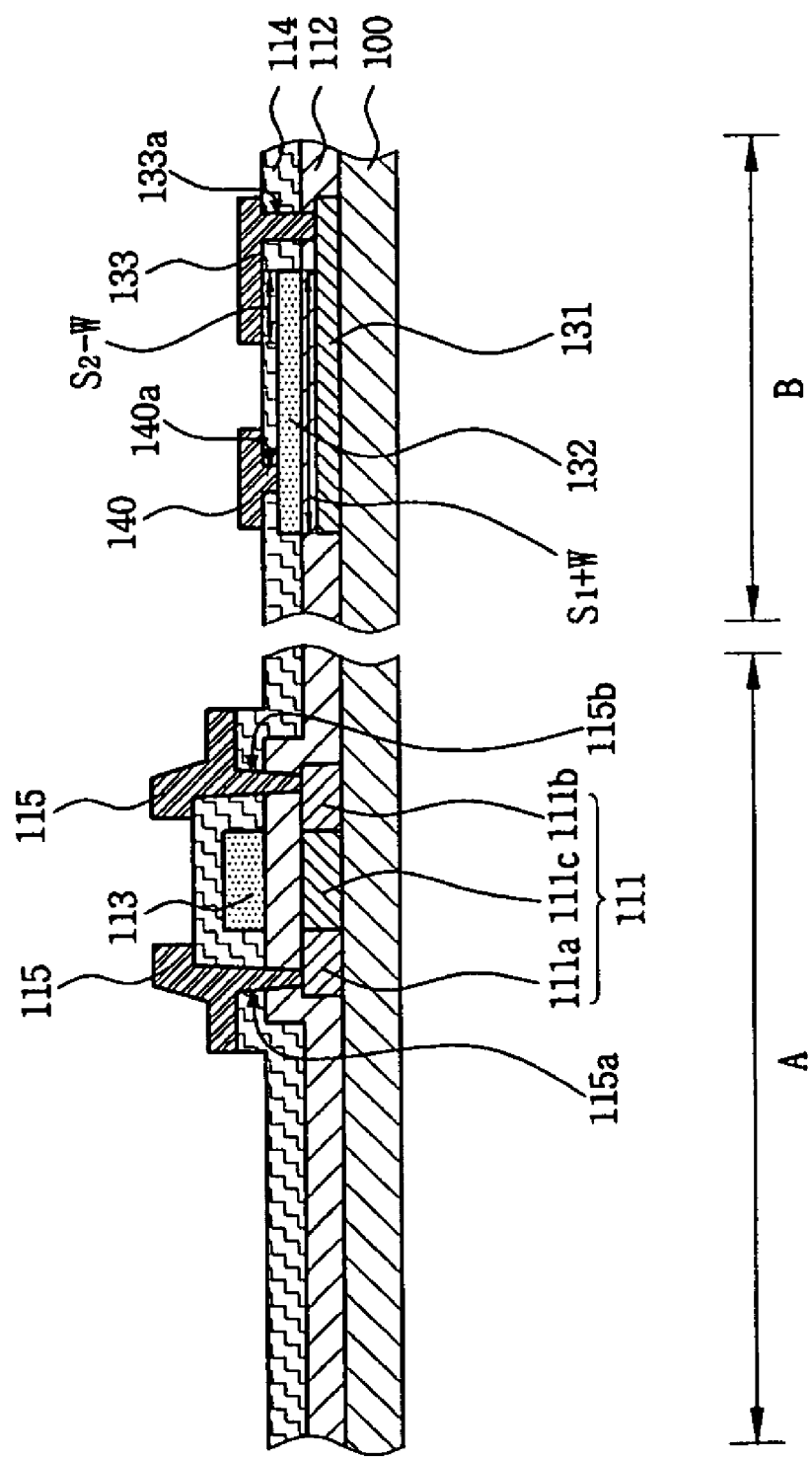

Referring to FIG. 2D, source and drain metal layers formed, for example, of one of Al, an Al alloy, Mo and a Mo alloy is deposited on the interlayer insulating layer 114.

The source and drain metal layers are patterned in a certain shape to form source and drain electrodes 115, which are respectively connected with the source and drain regions 111a and 111b of the semiconductor layer 111 through the first and second contact holes 115a and 115b in the first region A.

A first power voltage line 140 connected with the second capacitor electrode 132 through the third contact hole 140a, and a third capacitor electrode 133 connected with the first capacitor electrode 131 through the fourth contact hole 133a are formed in the second region B.

Here, the first capacitor electrode 131 and the second capacitor electrode 132 constitute a first capacitor (Cst1), wherein the first capacitor electrode 131 is a lower electrode of the first capacitor (Cst1), and the second capacitor electrode 132 is an upper electrode of the first capacitor (Cst1). The second capacitor electrode 132 and the third capacitor electrode 133 constitute a second capacitor (Cst2), wherein the second capacitor electrode 132 is a lower electrode of the second capacitor (Cst2), and the third capacitor electrode 133 is an upper electrode of the second capacitor (Cst2). As a result, the first and second capacitors form a capacitor (Cst).

The first capacitor electrode 131 and the third capacitor electrode 133 are different in area. To preserve the total capacitance and increase the spacing between the third capacitor electrode 133, the area of the first capacitor electrode 131 is larger than the area of the third capacitor electrode 133.

Here, the capacitance of the capacitor between two electrodes may be expressed by the following equation.

$$C=\epsilon(S/d)$$

Here, $\epsilon$ represents permittivity, S represents area between the two electrodes, and d represents a distance between two electrodes.

When the area of the third capacitor electrode 133, i.e., the upper electrode of the second capacitor (Cst2), is smaller than a certain area $S_2$, the corresponding area between the third capacitor electrode 133 and the second capacitor electrode 132 is smaller by a variation W in area of the capacitor. As a result, the capacitance of the second capacitor (Cst2) is reduced by $\epsilon_2 W/d_2$, that is $Cst2=\epsilon_2 S_2/d_2-\epsilon_2 W/d_2$.

Similarly, when the area of the first capacitor electrode 131, i.e., the lower electrode of the first capacitor (Cst1), is larger than a certain area $S_1(=S_2)$, the corresponding area between the first capacitor electrode 131 and the second capacitor electrode 132 is larger by W. Accordingly, the capacitance of the first capacitor (Cst1) is increased by $\epsilon_1 W/d_1$, that is $Cst1=\epsilon_1 S_1/d_1+\epsilon_1 W/d_1$.

As a result, the first capacitor electrode 131 corresponding to the second capacitor electrode 132 and the third capacitor electrode 133 have an area difference of W×2.

Therefore, capacitance of the capacitor (Cst) is the same as the capacitance of the capacitor if the areas of the third capacitor electrode 133 and the first capacitor electrode 131 were both the same, that is $Cst=Cst1+Cst2=\epsilon_1 S_1/d_1+\epsilon_1 W/d_1+\epsilon_2 S_2/d_2-\epsilon_2 W/d_2$. When the permittivity and distance between the first capacitor (Cst1) and the second capacitor (Cst2) are equal, $\epsilon_1 W/d_1=\epsilon_2 W/d_2$, and $Cst=\epsilon_1 S_1/d_1+\epsilon_2 S_2/d_2$. Therefore, when the permittivity and distance between the first capacitor (Cst1) and the second capacitor (Cst2) are equal, the capacitance Cst is equal to the capacitance if the area of the first capacitor Cst1 and the area of second capacitor Cst2 were both the same.

Accordingly, in the above-described manner, while maintaining the same total capacitance, the distance between the first power voltage line 140 and the third capacitor electrode 133 may be increased, thereby preventing a short circuit between the first power voltage line 140 and the third capacitor electrode 133 which may occur in fabrication.

Figure 2E:
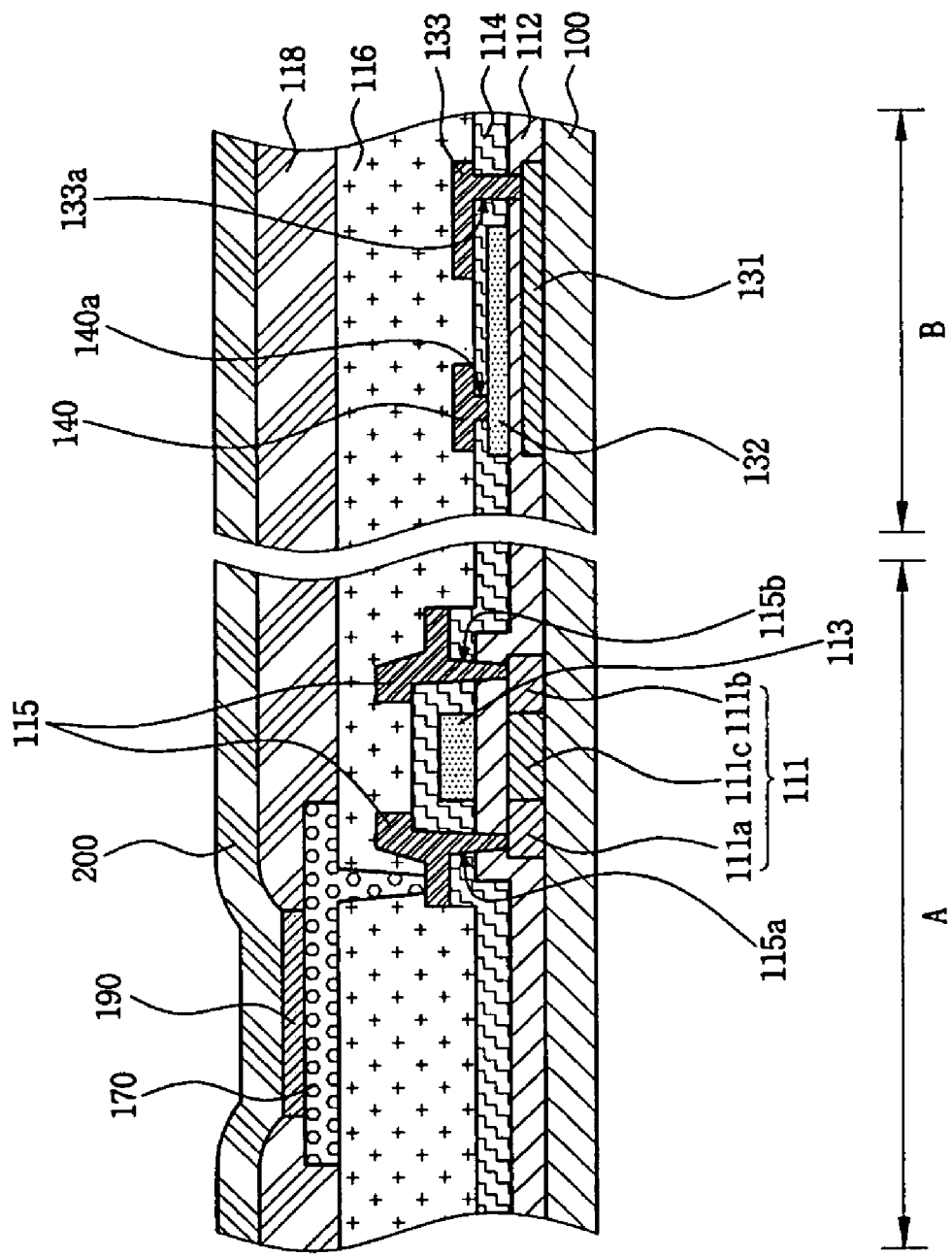

Then, referring to FIG. 2E, a passivation layer 116, formed, for example, of $SiO_2$, SiNx or a multi-layer thereof is formed on the entire surface of the substrate, and a planarization layer (not illustrated) formed, for example, of an organic material may be formed to reduce a step height on the substrate.

Here, a pixel electrode 170 electrically connected with one of the source and drain electrodes 115 through a via hole passing through the passivation layer 116 or the planarization layer is formed in the first region A. The pixel electrode 170 may have a stacked structure of a transparent electrode such as indium tin oxide (ITO) or indium zinc oxide (IZO) and a reflective electrode formed of one selected from the group consisting of Pt, Au, Ir, Cr, Mg, Ag, Al and an alloy thereof.

A pixel defining layer 118 including an opening exposing a partial region of the pixel electrode 170 is formed on the entire surface of the substrate. The pixel defining layer 118 may be formed, for example, of one selected from the group consisting of benzocyclobutene (BCB), an acryl-based polymer and polyimide.

Then, an organic layer 190 including an organic emitting layer may be formed on the pixel electrode 170 exposed by the opening, and a counter electrode 200 may be formed on the entire surface of the substrate.

Consequently, according to a flat panel display device and a method of fabricating the same, it is possible to ensure the distance between a first power voltage line and a third capacitor electrode by reducing the area of the third capacitor electrode of a capacitor (Cst). At the same time, the capacitance of the capacitor (Cst) according to the reduction in area of the third capacitor electrode may be compensated by increasing the area of a first capacitor electrode.

Thus, a dark spot caused by a short circuit between the first power voltage line and the third capacitor electrode may be prevented while retaining the capacitance of the capacitor (Cst) and decreasing the area of the third capacitor electrode.

Although the certain embodiments been described with reference to the figures, it will be understood by those skilled in the art that a variety of modifications and variations may be made to the embodiments without departing from the spirit or scope of the present invention.

What is claimed is:

1. A flat panel display device, comprising:
   a substrate including a first region on which an organic light emitting diode and a thin film transistor are formed and a second region on which a capacitor is formed;
   a semiconductor layer including source and drain regions on the first region;
   a first capacitor electrode formed on the second region;
   a gate insulating layer formed on the substrate;
   a gate electrode formed on the first region on the gate insulating layer;
   a second capacitor electrode formed on the second region;
   an interlayer insulating layer formed on the substrate;
   source and drain electrodes formed on the first region on the interlayer insulating layer and connected with the semiconductor layer through first and second contact holes;
   a first power voltage line formed on the second region connected with the second capacitor electrode through a third contact hole; and
   a third capacitor electrode formed on the second region connected with the first capacitor electrode through a fourth contact hole, and having a different area from the first capacitor electrode.

2. The display device according to claim 1, wherein the first capacitor electrode is formed from the same material as the semiconductor layer.

3. The display device according to claim 1, wherein the second capacitor electrode is formed from the same material as the gate electrode.

4. The display device according to claim 1, wherein the first power voltage line is formed from the same material as the source and drain electrodes.

5. The display device according to claim 1, wherein the third capacitor electrode is formed from the same material as the source and drain electrodes.

6. The display device according to claim 1, wherein the first capacitor electrode is formed in substantially the same layer as the semiconductor layer.

7. The display device according to claim 1, wherein the second capacitor electrode is formed in substantially the same layer as the gate electrode.

8. The display device according to claim 1, wherein the first power voltage line is formed in substantially the same layer as the source and drain electrodes.

9. The display device according to claim 1, wherein the third capacitor electrode is formed in substantially the same layer as the source and drain electrodes.

10. The display device according to claim 1, wherein the first capacitor electrode corresponding to the second capacitor electrode and the third capacitor electrode have an area difference of W×2 and wherein W is a variation in the area of the capacitor.

* * * * *